(12) United States Patent
Jeter et al.

(10) Patent No.: US 10,991,403 B2
(45) Date of Patent: Apr. 27, 2021

(54) MEMORY CALIBRATION WITH END POINT REPLAY

(71) Applicant: Apple Inc., Cupertino, CA (US)

(72) Inventors: Robert E. Jeter, Santa Clara, CA (US); Rakesh L. Notani, Santa Clara, CA (US); Venkata R. Malladi, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 16/277,804

(22) Filed: Feb. 15, 2019

(65) Prior Publication Data
US 2020/0265881 A1    Aug. 20, 2020

(51) Int. Cl.
*G11C 7/22* (2006.01)

(52) U.S. Cl.
CPC ...... *G11C 7/222* (2013.01); *G11C 2207/2254* (2013.01)

(58) Field of Classification Search
CPC .................................................. G11C 7/222
USPC ........................................................ 365/193
See application file for complete search history.

(56) References Cited

U.S. PATENT DOCUMENTS

| | | | |
|---|---|---|---|
| 7,698,589 B2 * | 4/2010 | Huang | G06F 5/06 713/401 |
| 8,117,483 B2 | 2/2012 | Welker et al. | |
| 8,379,457 B1 | 2/2013 | Chen | |
| 8,391,089 B2 | 3/2013 | Chen et al. | |
| 9,672,882 B1 | 6/2017 | Jeter et al. | |
| 2016/0292094 A1 * | 10/2016 | Jeter | G06F 13/1668 |

* cited by examiner

*Primary Examiner* — Muna A Techane
(74) *Attorney, Agent, or Firm* — Kowert, Hood, Munyon, Rankin & Goetzel, P.C.; Erik A. Heter

(57) ABSTRACT

A method and apparatus for performing memory calibration with endpoint replay is disclosed. A first calibration of a data strobe signal in a memory subsystem is performed. The first calibration includes determining initial values of first and second endpoints indicative of first and second delay values, respectively, applied to the data strobe signal. A second calibration of the data strobe signal is performed around these endpoints, within a range thereof that is less than a full range there between. Based on the second calibration, the endpoints are adjusted.

20 Claims, 6 Drawing Sheets ural signal
MEMORY CALIBRATION WITH END POINT REPLAY

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis.

SUMMARY

A method and apparatus for performing memory calibration with endpoint replay is disclosed. In one embodiment, a first calibration of a data strobe signal in a memory subsystem is performed. The first calibration includes determining initial values of first and second endpoints indicative of first and second delay values, respectively, applied to the data strobe signal. A second calibration of the data strobe signal is performed around these endpoints, within a range thereof that is less than a full range there between. Based on the second calibration, the endpoints are adjusted.

In one embodiment, performing the first calibration comprises transmissions of a first number of bits being conveyed between a memory controller and a memory. The second calibration comprises transmissions of a second number of bits being conveyed between the memory controller and the memory, wherein the second number of bits is greater than the first. The transmissions in the first and second calibrations each include writing data to memory and reading data therefrom, with the transmissions of data being synchronized by the data strobe signal having various amounts of delay applied thereto. Based at least in part on these calibrations, a width of an eye pattern may be determined, the eye pattern being indicative of a range of delay values and a range of reference voltages at which data may be correctly written to and read from memory.

BRIEF DESCRIPTION OF THE DRAWINGS

The following detailed description makes reference to the accompanying drawings, which are now briefly described.

Figure 1:
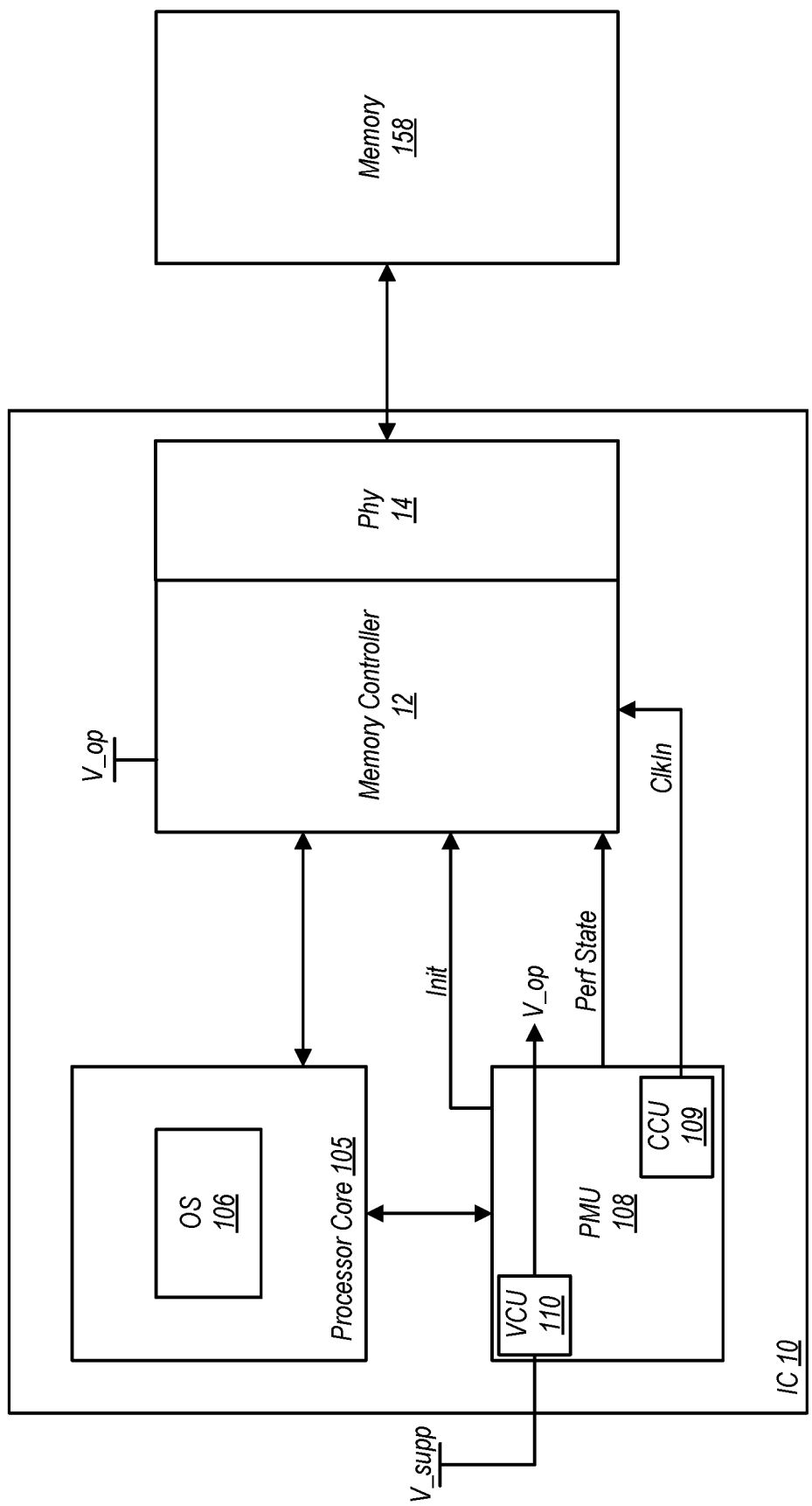
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it), Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to various method and apparatus embodiments in which calibrations are performed with endpoint replay. The endpoints as defined herein may be those points defining the minimum and maximum delay times that can be applied to a data strobe signal (used to synchronize data transfers between a memory and a memory controller) while still able to correctly write to and/or read from memory. With respect to an eye pattern, the endpoints may be defined as those points on the horizontal axis thereof where the eye pattern begins and ends.

An initial calibration may be performed in which data is written to and/or read from memory with varying amounts of delay applied to a data strobe signal. From this initial calibration, an initial set of endpoints are determined. A second, subsequent calibration is then performed, focusing on the endpoints. Rather than perform the calibration between the full range between the initially determined endpoints, the second calibration (which may be referred to as an endpoint replay calibration) is performed in a restricted range around each of the endpoints. From the endpoint replay calibration, adjusted endpoints may be determined.

In various embodiments, the initial, or first calibration may be referred to as a light calibration, while the second calibration may be referred to a heavy calibration. The light calibration may include conveying a lower number of bits (e.g., 16) per transmission, while a higher number of bits (e.g., 128) may be conveyed per transmission during the heavy calibration. The light calibration may be sufficient for approximating the width of the eye pattern. The heavy calibration performed in the restricted range near the initial endpoints may provide a more accurate reading of the actual endpoints of the eye pattern, and thus may also allow the eye pattern to more accurately represent the range of delay values as applied to the data strobe signal that enable data transferred between the memory and memory controller to be read/written with the correct values.

Turning now to FIG. 1, a block diagram of one embodiment of an integrated circuit (IC) coupled to a memory is shown. IC 10 is shown here as a simplified block diagram including various units/circuits implemented thereon. However, other embodiments are possible and contemplated, and may include additional circuits/units not shown here or explicitly discussed herein. IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same (or additional cores of a different type) may be present. Processor core 105 is configured to execute software instructions, including those of operating system (OS) 106. The instructions of OS 106 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 106 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions.

Figure 2:
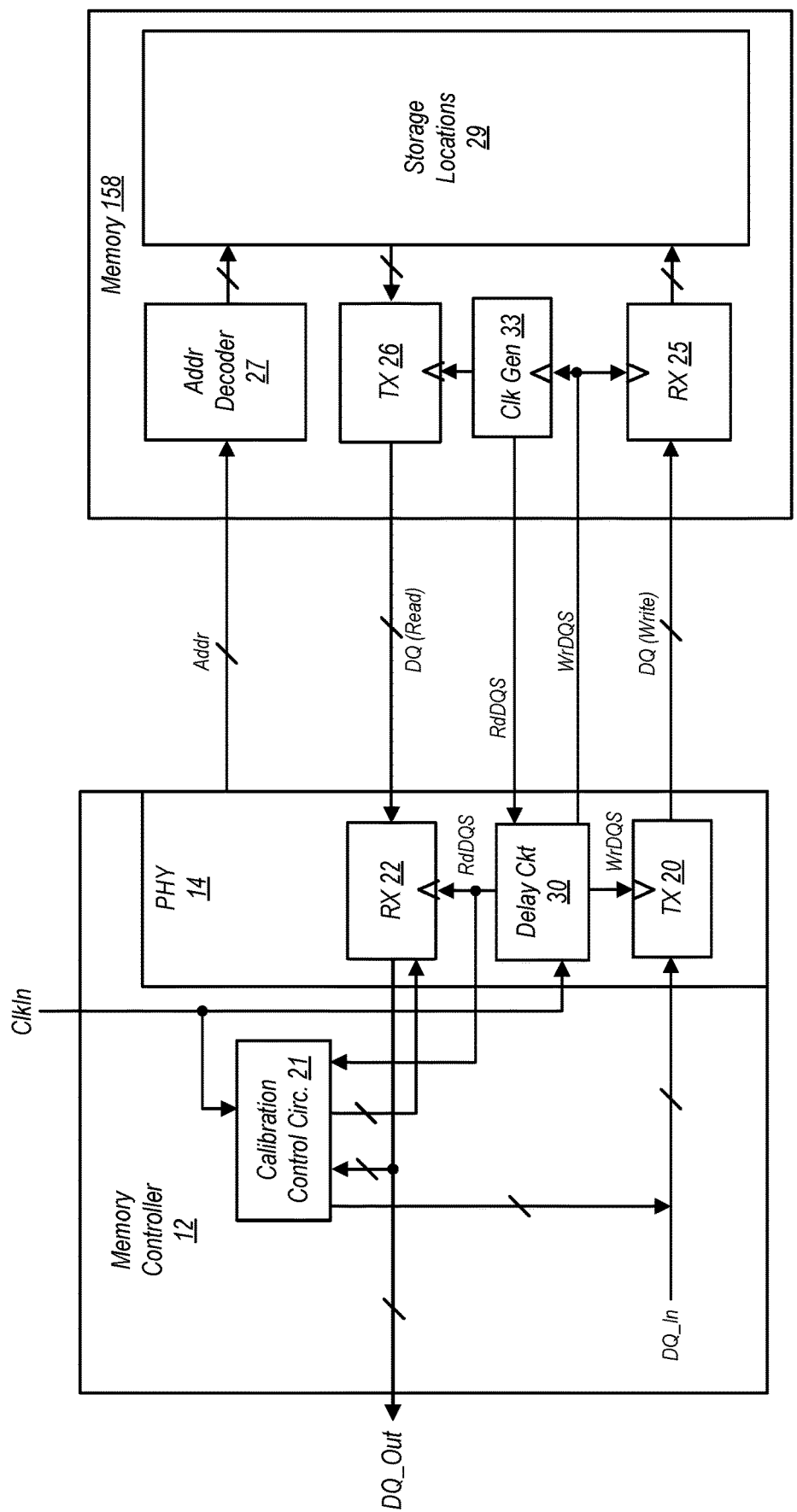
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data that is read from memory 158, and a transmitter 20 configured to transmit data for writing to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control circuit 21, which includes circuitry that performs various embodiments of a calibration method as further discussed below.

Physical layer 14 includes a delay circuit 30 that is coupled to receive an input clock signal ('Clk'). In the embodiment shown, delay circuit 30 may include two separate paths to apply delays to the input clock signal to generate a write data strobe ('WrDQS') and to apply delay to a read data strobe ('RdDQS') received from memory 158. For example, one embodiment of delay circuit 30 may include a pair of delay locked loops (DLLs), one configured to output the write data strobe to memory, and one configured to apply delay to the read data strobe received from memory. The delays of the respective DLL's may be set according to control signals generated elsewhere in memory controller 12, e.g., in calibration control circuit 21. Types of delay circuits other than DLL's are also possible and contemplated for various other embodiments. Delay circuit 30 in the embodiment shown receives the read data strobe from clock generation circuit 33 and provides a corresponding version of the read data strobe to receiver 22 in physical layer 14. The read data strobe signal may be used in synchronizing reads of data from memory 158. The write data strobe in the embodiment shown is provided from delay circuit 30 to transmitter 20 of physical layer 14, and also provided to receiver 25 in memory 158. Accordingly, the write data strobe may be used in synchronizing writes to memory 158.

Memory 158 in the embodiment shown includes an address decoder 27 coupled to receive an address ('Addr') from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations. Memory 158 also includes a receiver 25 coupled to receive data to be written (DQ(Write)) to those storage locations 29 selected by address decoder 27. Receiver 25 is also coupled to receive the write data strobe, WrDQS. The write data strobe signal is also provided to a clock generation circuit 33, which is configured to generate the read data strobe, RdDQS, based on the write data strobe. Clock generation circuit 33 may be implemented using various types of circuitry, such as a delay locked loop (DLL) or other circuit that can output a periodic signal based on an input periodic signal. The read data strobe is provided both to transmitter 26 in memory 158 (from which read data, DQ(Read), is conveyed to memory controller 12), as well as directly to delay circuit 30 in memory controller 12.

Calibrations of the data strobe signals may be performed under the direction of calibration control circuit 21 in the embodiment shown. The data strobe signals provided/received by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram (or eye pattern). Accordingly, procedures to calibrate the data strobe signals to compensate for inherent delays may be performed at certain times during operation of memory controller 12 in order to optimize the point in time at which the data strobe signals sample data. The calibration procedures conducted under the control of calibration control circuit 21 involve performing a number of reads of from memory along with adjustments of an amount of delay applied to the data strobe signal being calibrated. The delays may be adjusted in accordance with a delay code that is provided from calibration control circuit 21 to delay circuit 30.

The calibration of the data strobe delay may be performed periodically, and may sometimes be referred to as a horizontal calibration. These calibrations may be conducted for both the read data strobe and the write data strobe.

Performing the calibrations in at least some cases may include performing an initial calibration followed by a calibration around the endpoints, which may be referred to as endpoint replay. Each calibration may be performed by performing writes of data to memory, followed by reads of the data therefrom, and comparing the data read from memory to expected data (e.g., that which was written). The range between the endpoints may define a range of delays, as applied to the data strobe signal under calibration, in which the data written/read is equal to the expected data.

The initial calibration may establish minimum and maximum delays that may be applied to the data strobe signal under calibration. These minimum and maximum delays correspond to the endpoints along the horizontal axis of an eye diagram. The calibration performed thereafter may be focused on the endpoints, and may be performed in a limited range around the same, rather than across the full range between the endpoints. During the initial calibration, which may be referred to as a 'light' calibration, a first number of bits (e.g., 16 bits) are transmitted per write/read cycle. The second calibration, performed around the endpoints, may be referred to as a 'heavy' calibration, with second number of bits (e.g., 128 bits) transmitted per write/read cycle. The second calibration may thus yield a more accurate picture as to the true location of the endpoints, and may thus yield a more accurate eye pattern. This in turn may provide the benefits of a heavy calibration while achieving the reduced time of a light calibration.

Figure 3:
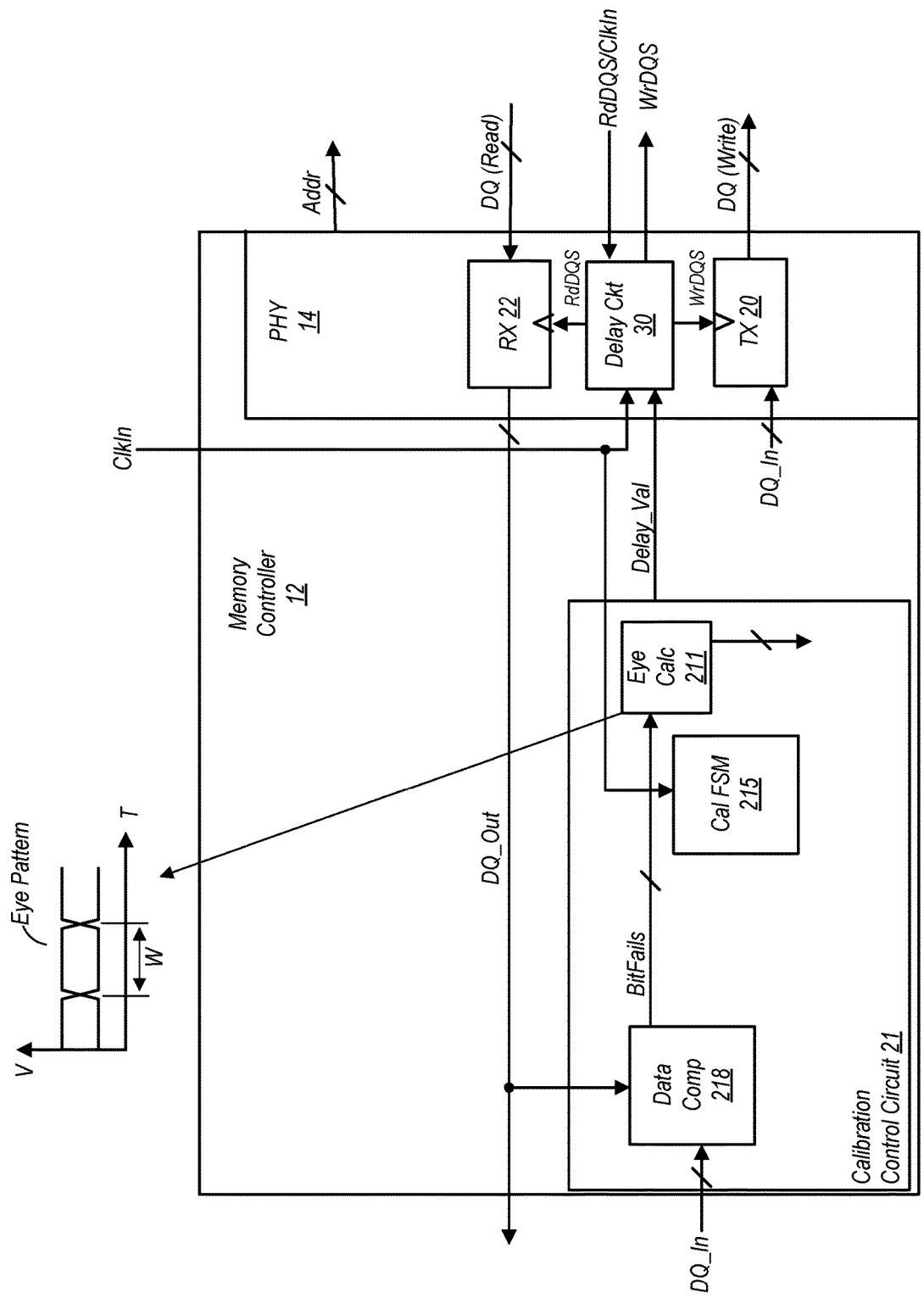
FIG. 3 is a block diagram illustrating one embodiment of a memory controller having a calibration control circuit.

FIG. 3 is a block diagram of one embodiment of a memory controller. In particular, FIG. 3 illustrates further details of one embodiment of a memory controller 12 that may be used in the memory subsystem discussed with reference to FIG. 2.

In the embodiment shown, calibration control circuit 21 includes calibration finite state machine (FSM) 215, data comparator 218, and an eye calculator 211. Calibration FSM 215 in the embodiment shown implements circuitry that includes a state machine that carries out various calibration functions. Among these functions performed by calibration FSM 215 is causing the incrementing of delay values in delay circuit between the data transmissions of the particular calibration being performed. In some embodiments, calibration FSM 215 may also generate data to be transmitted during the performance of a calibration (or iteration thereof), although embodiments where such calibration data is generated elsewhere are also possible and contemplated.

As noted above, calibration control circuit 21 may provide a delay code ('Delay_Val' in this figure) to delay circuit 30 in order to set and vary the delay applied to the data strobe signals. The delay code may be generated by, e.g. calibration FSM 215, or other circuitry within calibration control circuit 21.

Data comparator 218 in the embodiment shown compares data received from the memory, during calibrations, to expected data. A passing result occurs when a bit of the received data matches the expected data. A failing result occurs when a bit of received data does not match the expected data. Information regarding bit failures are forwarded from data comparator to eye calculator 211. Based on the pass fail information received, eye calculator 211 may determine a range of delay values, as applied to the data strobe signal under calibration, for which passing results are obtained. Additionally, eye calculator 211 may also include registers or some other suitable storage mechanism for storing the various values corresponding to the eye pattern. An example eye pattern is shown in the upper portion of FIG. 3, with the value W along the horizontal axis ('T') indicative of the width thereof.

It is noted that calibration control circuit 21 may also perform reference voltage calibrations (which may be referred to as vertical calibrations, along the 'V' axis as shown in the example eye diagram, where 'V' is representative of various values of a reference voltage). The reference voltage is a voltage that is used to distinguish between a logic 0 and a logic 1 as received. Thus, the eye pattern determined by eye calculator is based both on various ranges of delay values (horizontal) and ranges of reference voltages (vertical). It is therefore noted that the calibrations that include endpoint replay as discussed herein may be performed for different values of the reference voltage, and further noted that both the initial and final endpoints may vary along with the reference voltage. Generally speaking the eye pattern may become narrower (from the horizontal perspective) for the highest and lowest values of the reference voltage, and wider for reference voltage values between these extremes.

The calibrations discussed herein may be performed periodically, or may be performed responsive to certain events (e.g., performance state changes). Generally speaking, these calibrations may be performed on any suitable schedule.

Figure 4:
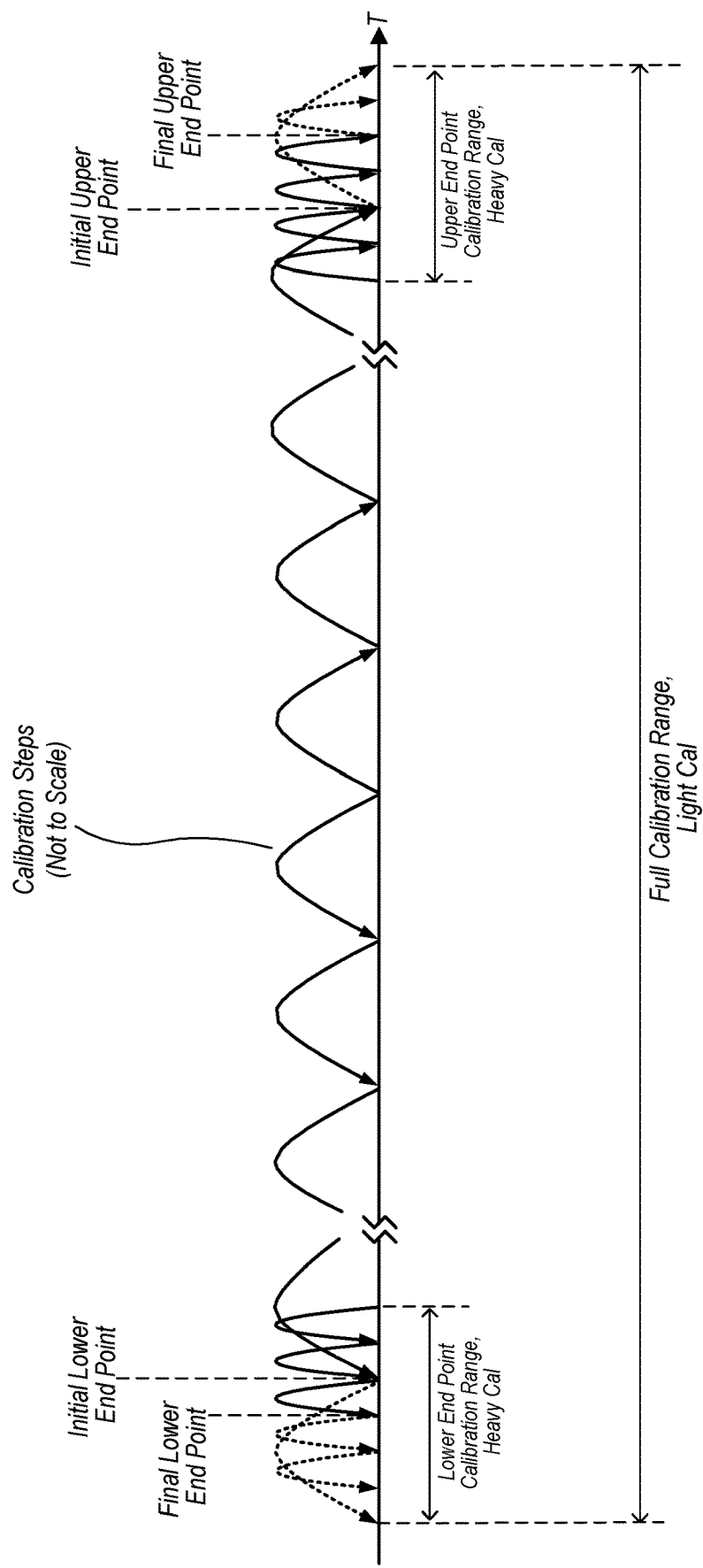
FIG. 4 is a graphic illustration of one embodiment of a method for performing calibrations with endpoint replay.

FIG. 4 is a graphic illustration of one embodiment of a method for performing calibrations with endpoint replay. It is noted that the size of the calibration steps shown in the drawing are not to scale, and are not meant to necessarily meant to indicate that the steps are smaller during the endpoint replay portion of the calibration (although this is possible in various embodiments). In general, the size of the calibration steps (which indicate variations in the delay applied to the data strobe under calibration) may be selected in any suitable manner, and may also be varied in any suitable manner.

In the illustration of FIG. 4, the calibration steps shown with solid lines are indicative of passing results, while those shown with dashed lines. On a per-bit basis, the full calibration range of the initial calibration is defined by the upper and lower delay values at which failing results for a given bit are first obtained. Thereafter, the endpoints are defined by the last values at which passing results for a given bit are obtained. More particularly, the initial lower endpoint is defined by lowest value T at which passing results are obtained, while the upper endpoint is defined by the highest value T at which passing results are obtained. As noted above, the calibration at which the initial endpoints are established is a light calibration as defined herein, with a lower number of bits transmitted per write/read cycle. This type of calibration may be performed for all bits, and ranges of values at which all bits provide passing results is also determined.

Subsequent to the calibration at which the initial endpoints are established, the second calibration (endpoint replay) is performed. This calibration includes a limited range calibration around the lower endpoint as well as a limited range calibration around the upper endpoint. Furthermore, as noted above, the second calibration may be a heavy calibration, with a greater number of bits used per write/read cycle relative to the light calibration that is initially performed. Performing endpoint replay calibration in the range around the initial endpoints may yield more accurate results, and may thus provide a more accurate determination as to the true value of the endpoints, yielding the accuracy benefit of a heavy calibration while also yielding the speed benefits of a light calibration.

In this particular example, the adjusted, final value lower endpoint has a lower value (with respect to the T axis) relative to the initial lower endpoint. Similarly, the final, adjusted value of the upper endpoint has a greater value than the initial upper endpoint. This is not necessarily always the case, as either one of the final endpoints can move in either direction along the T axis with respect to their initial values. Furthermore, the final adjusted width of the eye, as defined by the distance between the final endpoints, may be greater or less than the initial value. Some embodiments may forgo making adjustments to the endpoints in instances where the difference between the initial and final endpoints is negligible.

Figure 5:
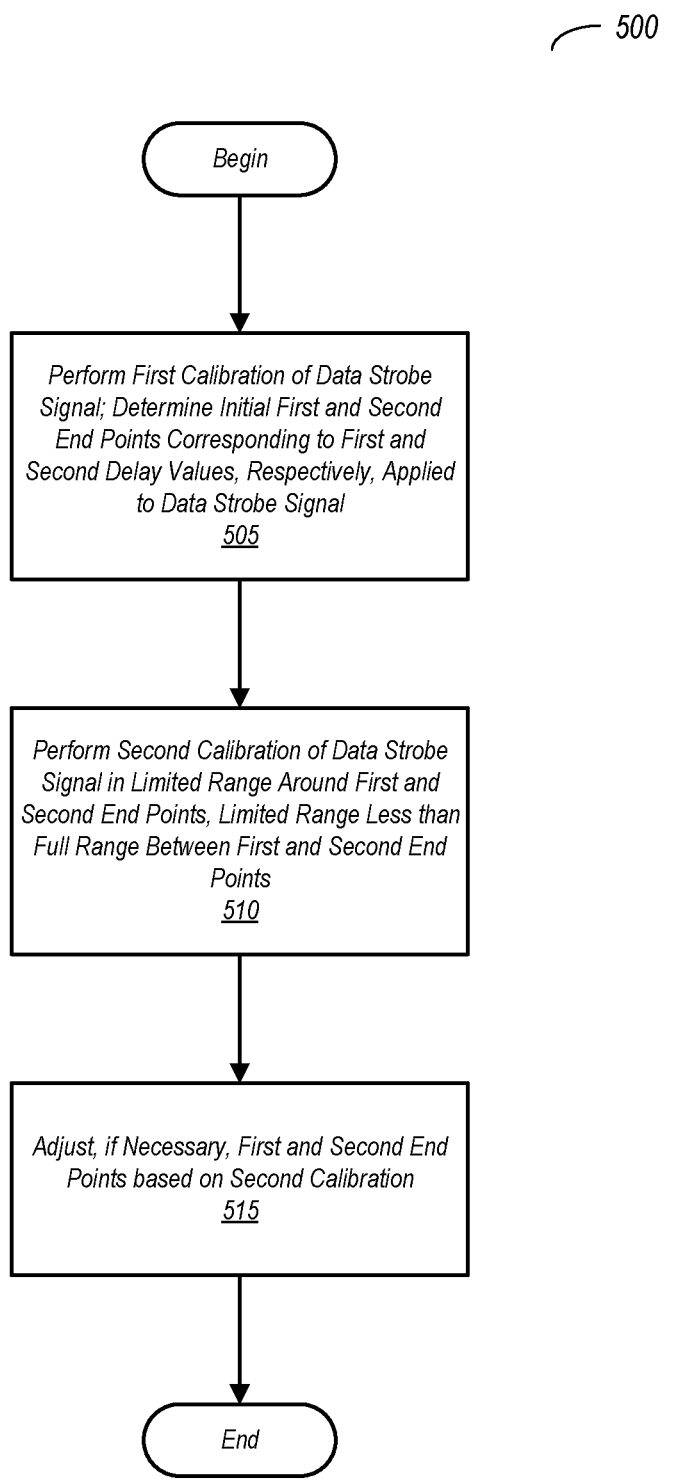
FIG. 5 is a flow diagram illustrating one embodiment of a method for performing calibrations with endpoint replay.

FIG. 5 is a flow diagram illustrating one embodiment of a method for performing calibrations with endpoint replay. Method 500 may be performed using any of the various apparatus embodiments discussed above. Apparatus embodiments not explicitly discussed herein but nevertheless capable of performing method 500 may also be considered to fall within the scope of this disclosure.

Method 500 begins with the performing of a first calibration of a data strobe signal and determining initial first and second endpoints corresponding to first and second delay values, respectively, as applied to the data strobe signal (block 505). As noted above, these endpoints may correspond to the extremes of a range of delay values at which passing results may be obtained for writes to and reads from memory. The various calibrations performed by method 500 include applying different delay values to the data strobe signal under calibration and performing writes, reads, and comparison of expected to actual data at these various delay values.

After the performance of the first calibration is complete, a second calibration of the data strobe signal is performed. The second calibration is performed in a limited range around each of the initial endpoints, this range being less than the full range between the initial values of the first and second endpoints (block 510). Based on the second calibration, adjustments to the first and second endpoints may be made, if necessary (block 515).

In various embodiments of the method described herein, the initial, first calibration may be a light calibration, with a lower number of bits transmitted per write/read cycle. The second calibration may be a heavy calibration, with a higher number of bits (relative to that of the first calibration) transmitted per write/read cycle. During each of the calibrations, different amounts of delay may be applied to the data strobe signal being calibrated, in accordance with a delay code provided to a delay circuit. Writes of data to memory and reads of data therefrom may be performed at each of these delay values, with the actual values written/read compared to expected values. From these calibrations, final (adjusted) values of first and second endpoints may be determined, with the first end corresponding to a least amount of delay, as applied to the data strobe signal, when all bits read from memory provide a passing result, and the second endpoint corresponding to a greatest amount of delay at which all bits read from memory provide a passing result. A number of these calibrations may be performed for different values of a reference voltage, and thus may facilitate determining an eye pattern. The eye pattern includes ranges of delay values, and also includes a range of reference voltages, the reference voltages being voltage levels that are used to distinguish between a logic 0 and a logic 1.

Figure 6:
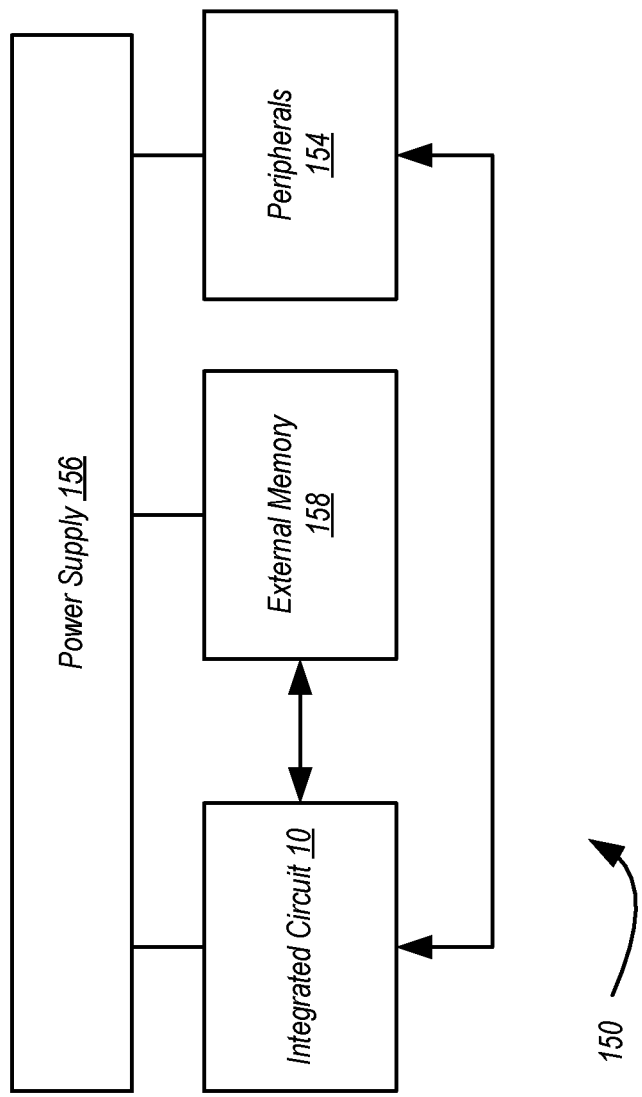
FIG. 6 is a block diagram of one embodiment of an example system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

IC 10 in the embodiment shown here may include a memory controller as discussed above in, e.g., FIGS. 2 and 3, while memory 158 may include various circuits as also discussed above. The various circuitry may be arranged to perform the various calibrations discussed in this disclosure.

Numerous variations and modifications will become apparent to those skilled in the art once the above disclosure is fully appreciated. It is intended that the following claims be interpreted to embrace all such variations and modifications.

What is claimed is:

1. A method comprising:
   performing a first calibration of a data strobe signal conveyed between a memory controller and a memory, wherein performing the first calibration further comprises determining initial values for first and second endpoints, the first and second endpoints indicative of respective first and second delay values applied to the data strobe signal;
   performing a second calibration of the data strobe signal, wherein the second calibration is performed within a limited range around the first endpoint and within a limited range around the second endpoint, wherein the limited ranges around the first endpoint and second endpoint are less than a full range between the first and second endpoints, wherein the first and second calibrations include the memory controller synchronizing data transfers between the memory controller and the memory using the data strobe signal; and
   adjusting the first and second endpoints based on results of the second calibration, wherein adjusting the first and second endpoints comprises adjusting the first and second delay values.

2. The method as recited in claim 1, wherein performing the first calibration comprises transmissions conveying a first number of bits between the memory controller and the memory, and wherein performing the second calibration comprises transmissions conveying a second number of bits between the memory controller and the memory, the second number being greater than the first number.

3. The method as recited in claim 1, wherein performing the first and second calibrations comprises applying different delay values to the data strobe signal.

4. The method as recited in claim 3, wherein applying different delay values to the data strobe signal comprises a calibration control circuit conveying a delay code to a delay unit.

5. The method as recited in claim 1, wherein performing the first and second calibrations comprises a calibration control circuit causing a plurality of writes of data to the memory and further comprises causing the memory controller to perform a plurality of reads of data from memory.

6. The method as recited in claim 1, wherein performing the first and second calibrations comprises the memory controller comparing data written to memory to data read from memory.

7. The method as recited in claim 1, wherein an adjusted value of the first endpoint comprises a least amount of delay at which all bits read from memory provide a first passing result, and wherein an adjusted value of the second endpoint comprises a greatest amount of delay at which all bits read from memory provide a second passing result.

8. The method as recited in claim 1, wherein performing the first and second calibrations comprises determining an eye pattern, the eye pattern including a range of delay values applied to the data strobe signal and further including a range of reference voltages used to distinguish a logic 0 from a logic 1.

9. An apparatus comprising:
a memory;
a memory controller coupled to the memory, wherein the memory controller is configured to synchronize data transfers to and from the memory using a data strobe signal conveyed between the memory controller and the memory, wherein the memory controller includes a calibration control circuit configured to:
perform a first calibration of the data strobe signal, wherein performing the first calibration includes the calibration circuit determining initial values for first and second endpoints indicative of first and second delay values applied to the data strobe signal;
perform a second calibration of the data strobe signal, wherein the second calibration is performed within a limited range around the first endpoint and a limited range around the second endpoint, wherein the limited ranges around the first endpoint and second endpoint are less than a full range between the first and second endpoints; and
adjust values of the first and second endpoints, based on results of the second calibration, by adjusting the first and second delay values, respectively.

10. The apparatus as recited in claim 9, wherein the calibration control circuit is configured to cause transmissions having a first number of bits to be conveyed between the memory controller and the memory during performance of the first calibration, and further configured to cause transmissions having a second number of bits to be conveyed between the memory control and the memory during performance of the second calibration, wherein the second number is greater than the first number.

11. The apparatus as recited in claim 9, wherein the calibration control circuit is configured to cause, during performance of the first and second calibrations, a plurality of writes of data to the memory and a plurality of reads of data from the memory.

12. The apparatus as recited in claim 9, wherein the calibration control circuit is configured to cause different amounts of delay to be applied to the data strobe signal.

13. The apparatus as recited in claim 12, wherein the calibration control circuit is configured to convey a delay code to a delay unit, wherein the delay code is indicative of an amount of delay to be applied to the data strobe signal for a given transmission.

14. The apparatus as recited in claim 9, wherein the calibration control circuit is configured to determine an eye pattern based on the first and second calibrations, wherein the eye pattern includes a range of delay values applied to the data strobe signal and further includes a range of reference voltage values, wherein the reference voltage is used to distinguish between a logic 1 and a logic 0.

15. The apparatus as recited in claim 9, wherein the calibration control circuit is configured to determine an adjusted value of the first endpoint based on determining that all bits read from memory provide a first passing result, and wherein the calibration control circuit is further configured to determine an adjusted value of the second endpoint based on determining that all bits read from memory provide a second passing result.

16. The apparatus as recited in claim 15, wherein the first passing result comprises all bits read from memory being equal to corresponding expected values with an amount of delay applied to the data strobe signal being equal to that of the first endpoint, and wherein the second passing result comprises all bits read from memory being equal to corresponding expected values with the amount of delay applied to the data strobe being equal to that of the second endpoint.

17. A system comprising:
a memory subsystem including a memory and a memory controller coupled to the memory, wherein the memory controller is configured to synchronize data transfers to and from the memory using a data strobe signal, and wherein the memory controller includes a calibration control circuit configured to:
perform a first calibration of the data strobe signal, wherein the first calibration comprises data transmissions between the memory and the memory controller having a first number of bits per transmission, and further comprises determining initial values of first and second endpoints of an eye pattern with respect to amounts of delay applied to the data strobe signal;
perform a second calibration of the data strobe signal, wherein the second calibration comprises data transmissions between the memory controller and the memory having a second number of bits per transmission, the second number being greater than the first, wherein the second calibration is performed within a limited range of delay values around the initial values of the first and second endpoints that is less than a full range between the first and second endpoints; and
determining adjusted values of the first and second endpoints based on results of the second calibration, wherein determining the adjusted values of the first and second endpoints comprises determining updated values of the first and second delay values, respectively.

18. The system as recited in claim 17, wherein the calibration control circuit is configured to convey a delay code to a delay unit, wherein the delay code is indicative of a specified amount of delay to be applied to the data strobe signal for a given transmission, and wherein the delay unit is configured to apply the specified amount of delay to the data strobe signal.

19. The system as recited in claim 17, wherein the calibration control circuit is configured to determine an adjusted value of the first endpoint based on determining that all bits read from memory provide a first passing result, and wherein the calibration control circuit is further configured to determine an adjusted value of the second endpoint based on determining that all bits read from memory provide a second passing result.

20. The system as recited in claim 19, wherein the first passing result comprises all bits read from memory being equal to corresponding expected values with an amount of delay applied to the data strobe signal being equal to that of the first endpoint, and wherein the second passing result comprises all bits read from memory being equal to corresponding expected values with the amount of delay applied to the data strobe being equal to that of the second endpoint.

* * * * *